(12) United States Patent
Miska et al.

(10) Patent No.: US 11,043,704 B2
(45) Date of Patent: Jun. 22, 2021

(54) DC PULSE BATTERY TESTING DEVICE AND METHOD FOR DETERMINING A BATTERY TYPE

(71) Applicant: Berghof Automation GmbH, Mühlhausen (DE)

(72) Inventors: Philipp Miska, Weinbergen (DE); Christopher Görls, Mühlhausen (DE)

(73) Assignee: Berghof Automation GmbH, Mühlhausen (DE)

( * ) Notice: Subject to any disclaimer, the term of this patent is extended or adjusted under 35 U.S.C. 154(b) by 27 days.

(21) Appl. No.: 16/306,365

(22) PCT Filed: May 31, 2017

(86) PCT No.: PCT/EP2017/063190
§ 371 (c)(1),
(2) Date: Feb. 12, 2019

(87) PCT Pub. No.: WO2017/207650
PCT Pub. Date: Dec. 7, 2017

(65) Prior Publication Data
US 2019/0252736 A1   Aug. 15, 2019

(30) Foreign Application Priority Data
May 31, 2016   (DE) ...................... 10 2016 006 419.6

(51) Int. Cl.
*H01M 10/42* (2006.01)
*H01M 10/48* (2006.01)
(Continued)

(52) U.S. Cl.
CPC ...... *H01M 10/4221* (2013.01); *G01R 31/378* (2019.01); *G01R 31/44* (2013.01);
(Continued)

(58) Field of Classification Search
CPC ............. H01M 10/4221; H01M 10/48; H01M 10/4285; H01M 2220/20; H01M 2220/30; G01R 31/44; G01R 31/378
See application file for complete search history.

(56) References Cited

U.S. PATENT DOCUMENTS 5,485,090 A * 1/1996 Stephens ............. H02J 7/00038
324/433
5,489,834 A   2/1996 Pitkanen
(Continued)

FOREIGN PATENT DOCUMENTS

CN      1664604 A    9/2005
CN   101288871 A   10/2008
(Continued)

OTHER PUBLICATIONS

Office Action dated Oct. 13, 2020 in corresponding Chinese Application No. CN 2017 8003 3864.5.
(Continued)

*Primary Examiner* — Dominic E Hawkins
(74) *Attorney, Agent, or Firm* — Mintz Levin Cohn Ferris Glovsky and Popeo, P.C.; Peter F. Corless; Carolina E. Säve (57) ABSTRACT

The invention relates to a method for identifying a battery type (Pb, Li ion) by means of a battery testing device (1), having the steps: application of a DC pulse having a current strength (IB) of at least 30. Ampere to a battery (18) to be tested for at least five seconds; before the application of the pulse, measurement of a pre-pulse voltage (U0) of the battery; during the application of the pulse, measurement of a pulse voltage (U1) of the battery; determination of a transition voltage difference between the pre-pulse voltage and the pulse voltage; determination of a characteristic of a transition voltage difference parameter in dependence upon the transition voltage difference; assignment of a specific
(Continued)

battery type (Pb, Li ion) to the tested battery in dependence upon the characteristic; and a battery testing device and a battery testing system.

14 Claims, 3 Drawing Sheets

(51) Int. Cl.
  *G01R 31/44* (2020.01)
  *G01R 31/378* (2019.01)
(52) U.S. Cl.
  CPC ....... *H01M 10/4285* (2013.01); *H01M 10/48* (2013.01); *H01M 2220/20* (2013.01); *H01M 2220/30* (2013.01)

(56) References Cited

U.S. PATENT DOCUMENTS

| | | | |
|---|---|---|---|
| 5,489,835 A * | 2/1996 | Stephens | H02J 7/00038 |
| | | | 320/106 |
| 6,404,164 B1 | 6/2002 | Bean et al. | |
| 2008/0024137 A1 * | 1/2008 | Carlin | G01R 31/386 |
| | | | 324/427 |
| 2008/0309284 A1 | 12/2008 | Choksi et al. | |
| 2012/0235593 A1 | 9/2012 | Snyder et al. | |
| 2012/0310565 A1 * | 12/2012 | Redey | G01R 31/367 |
| | | | 702/63 |
| 2016/0018471 A1 | 1/2016 | Lee | |
| 2016/0178706 A1 * | 6/2016 | Liu | G01R 31/392 |
| | | | 702/63 |

FOREIGN PATENT DOCUMENTS

| | | |
|---|---|---|
| CN | 103424706 A | 12/2013 |
| DE | 3826262 A1 | 2/1990 |
| DE | 69424696 T2 | 9/2000 |
| DE | 102010062412 A1 | 9/2011 |
| EP | 1065774 A2 | 1/2001 |

OTHER PUBLICATIONS

Chinese Search Report—English Translation—issued in Chinese Office Action dated Oct. 13, 2020 in corresponding Chinese Application No. CN 2017 8003 3864.5.

* cited by examiner

DC PULSE BATTERY TESTING DEVICE AND METHOD FOR DETERMINING A BATTERY TYPE

CROSS-REFERENCE TO RELATED APPLICATION

This application is a 35 U.S.C. § 371 U.S. national entry of International Application PCT/EP2017/063190, having an international filing date of May 31, 2017, which claims priority from German Application No. 10 2016 006 419.6 filed on May 31, 2016. The entire contents of these applications are incorporated herein by reference in their entirety.

The invention relates to a battery testing device, especially for a motor vehicle battery, having a voltage measuring unit and a DC generator, and to a method for identifying a battery type by means of a battery testing device.

Particularly in motor vehicles, but also in other machines, rechargeable batteries (also referred to synonymously as batteries hereinbelow) are used to provide electrical energy for an electric motor, for electrical consumers and/or starter energy for an internal combustion engine. In many such applications, and so also in the field of road-bound motor vehicles, the service life of the battery is often designed to be lower than that of the vehicle. For such applications it is therefore necessary for the battery to be tested from time to time and if necessary replaced. Whether replacement is required, is determined, for example, in motor vehicle workshops by means of a battery testing device which, after connection of the device to the battery, determines whether the battery needs to be replaced as a result of its already exhibiting too high a degree of ageing and corresponding degeneration of its performance factors. Such battery testing devices can also be used in test laboratories, for example of vehicle manufacturers or parts suppliers, as well as in motor manufacturer assembly lines.

For many years, the batteries used for vehicle batteries were essentially those composed of suitably interconnected lead battery cells as secondary cell basis. In recent years, however, the ever increasing amount of electrical power required in a vehicle, which can result both from an increased requirement by electrical consumers and from the use of hybrid drive concepts with internal combustion and electric motors, has led to an increased use of vehicle batteries composed of other secondary cells, for example lithium ion secondary cells (Li ion).

It is therefore increasingly difficult to obtain reliable information about the ageing-related performance of a vehicle battery using conventional battery testing devices, especially because the electrochemical processes in batteries having a different secondary cell basis (that is to say: in different types of battery) are very different.

A particular challenge is also to obtain reliable information in respect of the battery type installed when the test is to be carried out with the battery fitted in the vehicle. This is often desirable, however, since it is laborious or, in certain situations, such as vehicle manufacture, undesirable to dismount the battery before the test.

It is therefore a problem of the invention to provide a battery testing device which reliably makes it possible to recognise, identify and/or differentiate between different battery types.

That problem is solved by a method for identifying a battery type according to claim 1 and by a battery testing device according to claim 14.

In accordance with one aspect of the invention there is proposed a battery testing device, especially for a motor vehicle battery, which has a voltage measuring unit and a current pulse generator for generating a DC pulse. The voltage measuring unit and the current pulse generator can each be connected to the poles of a battery to be tested. The battery testing device is configured to apply a DC pulse to a battery to be tested for at least one second; before the application of the pulse, to measure a first voltage of the battery at a first timepoint; during the application of the pulse, to measure a second voltage of the battery at a second timepoint; to determine a characteristic of a first assignment parameter in dependence upon a first voltage difference between the first voltage and the second voltage; to assign a specific battery type to the tested battery in dependence upon the characteristic of the first assignment parameter.

In accordance with a further aspect of the invention there is proposed a method for identifying a battery type by means of a battery testing device especially in the context of the above-described aspect of the invention, having the steps: a DC pulse is applied to a battery to be tested for at least one second; before the application of the pulse, a first voltage of the battery is measured at a first timepoint; during the application of the pulse, a second voltage of the battery is measured at a second timepoint; a characteristic of a first assignment parameter is determined in dependence upon a first voltage difference between the first voltage and the second voltage; and a specific battery type is assigned to the tested battery in dependence upon the characteristic of the first assignment parameter.

In accordance with a further aspect there is provided a method for identifying a battery type by means of a battery testing device, having the steps: (a) application of a DC pulse of at least 30 Ampere, especially 80 Ampere, to a battery to be tested for at least five seconds, (b) before the application of the pulse, measurement of a pre-pulse voltage of the battery, (c) during the application of the pulse, measurement of a pulse voltage of the battery, (d) determination of a transition voltage difference between the pre-pulse voltage and the pulse voltage, (e) determination of a characteristic of a transition voltage difference parameter in dependence upon the transition voltage difference, (f) assignment of a specific battery type to the tested battery in dependence upon the characteristic.

A battery type in the context of the invention is preferably a set of batteries which, while they may be otherwise different, all have a similar secondary cell basis, that is to say especially an at least substantially identical galvanic pairing.

In accordance with a further aspect there is provided a battery testing device for a motor vehicle battery, having a voltage measuring unit and a current pulse generator for generating a DC pulse, wherein the voltage measuring unit and the current pulse generator can each be connected to the poles of a vehicle battery to be tested, and wherein the battery testing device is configured (A) to measure a voltage of the battery at each of a plurality of timepoints before, during and/or after application of a DC pulse having a current strength of at least 30 Ampere, especially 80 Ampere, to the vehicle battery for at least five seconds, (B) to determine a voltage difference from at least one pair, especially from each of a plurality of pairs, of measured voltages, (C) to determine in each case a characteristic of an assignment parameter in dependence upon the voltage difference(s) determined, (D) in respect of each assignment parameter, to assign a specific battery type to the tested vehicle battery in dependence upon the respective characteristic.

The invention is based inter alia on the finding that batteries based on different secondary cells (that is to say different battery types) exhibit different voltage behaviour and different voltage build-ups over time, especially during and/or after the introduction of a DC pulse into the battery over a period of several seconds. A battery testing device in accordance with one embodiment of the invention, for example when carrying out a method in accordance with the invention, is especially able to measure such different voltage behaviour and the different voltage build-up of batteries of different types, to process them and assign them to specific battery types and accordingly identify the latter.

The invention is described hereinbelow primarily in the context of the differentiation of lead batteries and Li ion batteries for motor vehicles, although the inventive concept relates generally to identification of any battery types in the sense that a battery-testing device and/or a method in accordance with the invention facilitates identification of specific or arbitrary galvanic pairings as secondary cells of a battery type thereby defined.

The DC pulse applied has especially a current strength of 30, 35, 40, 50, 60, 70, 80, 90, 100, 120 or 130 Ampere, preferably of between 60 and 100 Ampere, and preferably has—depending upon the application—a voltage of 14.4 V or 14.7 V or 14.9 V or 15.2 V, especially in a test intended to differentiate between Li ion batteries and lead batteries. Depending upon the test setting, the corresponding pulse can be applied for a period of one, two, five, eight, ten, twelve, 15, 20 or 30 seconds, preferably for a period of from eight to twelve seconds.

A particular advantage of applying a DC current of such high current strength over such a long period is that the battery test can then also be carried out on a battery that is installed and connected—for example in a vehicle—without the connected consumers and/or the connected on-board network appreciably falsifying the test result. In particular, in this case the electrical system of the vehicle having the battery is excited by the DC pulse in such a way that any effects of the connection environment on the battery are so small in comparison that they are unable to affect the test result in a relevant way.

In accordance with an embodiment of the method, the DC pulse has an at least substantially constant current strength in the range of between 60 and 120 Ampere, especially in order to cover effects of a connection environment of an inbuilt battery to be tested.

In order that the build-up of the voltage (and optionally also of the response current) over time can be observed for a sufficiently long time during the pulse, in accordance with one embodiment the DC pulse is applied to the battery for a period in the range of between eight and 15 seconds.

For that purpose, in accordance with one embodiment it is also possible to carry out the following method steps: measurement of at least one further pulse voltage of the battery at at least one further timepoint during the application of the pulse; determination of a characteristic of at least one pulse voltage difference parameter in dependence upon a pulse voltage difference between two measured pulse voltages; assignment of a specific battery type to the tested battery in dependence upon the characteristic.

Preferably, a pulse voltage of the battery is measured at a plurality of timepoints, especially a total of ten or fifteen timepoints, during the application of the pulse; and a characteristic of at least one further pulse voltage difference parameter is determined in dependence upon at least one pulse voltage difference between two of the measured pulse voltages; and a specific battery type is assigned to the tested battery in dependence upon the characteristic.

Recording of voltage values (and optionally response current values) at a relatively large number of timepoints during the DC pulse can assist in the identification of the battery type especially when the battery being tested is not tested in the maximum state of charge but in an unknown partially charged state. For that purpose, for example the assignment parameters mentioned below come into consideration.

In order to facilitate the identification of the battery type in batteries in any state of charge, in accordance with one embodiment a characteristic of a voltage difference mean value parameter is determined in dependence upon a mean value of voltage differences arising between voltages measured at adjacent times before or during the application of the pulse, and a specific battery type is assigned to the tested battery in dependence upon the characteristic.

In accordance with one embodiment, a characteristic of a voltage difference discharge parameter is determined in dependence upon the development over time of the voltage changes between voltages measured at adjacent times before or during the application of the pulse, and a specific battery type is assigned to the tested battery in dependence upon the characteristic. This can also facilitate the identification of the battery type in batteries in any state of charge.

Especially when carrying out tests on batteries in a maximum state of charge, in accordance with one embodiment a characteristic of a pre-pulse voltage parameter is determined in dependence upon the pre-pulse voltage, and a specific battery type is assigned to the tested battery in dependence upon the characteristic.

In order further to facilitate the differentiation of battery types in the case of batteries in a maximum state of charge, in accordance with one embodiment a pulse response current is measured at each of a plurality of timepoints during the application of the DC pulse; and a characteristic of at least one pulse current difference parameter is determined in dependence upon at least one current difference between two measured pulse response currents; and a specific battery type is assigned to the tested battery in dependence upon the characteristic.

To the same end, in accordance with one embodiment it is also possible to determine a characteristic of an application current difference parameter in dependence upon at least one application current difference between the application current and a measured pulse response current, and to assign a specific battery type to the tested battery in dependence upon the characteristic.

Preferably, a pulse response current of the battery is measured at a plurality of timepoints, especially a total of ten or fifteen timepoints, before or during the application of the pulse (especially at one timepoint before and 14 timepoints during the pulse); a characteristic of at least one further pulse current difference parameter is determined in dependence upon at least one current difference between two of the measured pulse response currents, and a specific battery type is assigned to the tested battery in dependence upon the characteristic.

In order also to be able to base the battery test on information resulting from a relationship between a measured voltage and a measured response current, in accordance with one embodiment both a pulse voltage and a pulse response current of the battery are measured at a plurality of timepoints, especially a total of ten or fifteen timepoints, during the application of the pulse.

In accordance with one embodiment, the battery test yields a result only when all or a certain number, for example the majority, of the assignment parameters being considered result in assignment to the same battery type on the basis of the particular characteristic under consideration.

In the case of such an embodiment, in dependence upon the assignment of the tested battery to a specific battery type in respect of one or more parameters, especially the assignment parameters under consideration, a specific battery type is allocated as test result if a characteristic which has been assigned to the same battery type is present in respect of all of the parameters under consideration or in respect of a predetermined proportion thereof. Accordingly, the reliability of the battery test can be adapted in accordance with the information accuracy required for the application in question.

In order to be able to carry out the various embodiments of the method with a suitable battery testing device, corresponding embodiments of such a battery testing device are provided:

In accordance with one embodiment there is provided a battery testing device, additionally having a current measuring unit, wherein the battery testing device is additionally configured: to measure a response current of the battery at each of a plurality of timepoints before, during and/or after the application of the DC pulse to the vehicle battery; to determine a current difference from at least one pair, especially from each of a plurality of pairs, of measured response currents; to determine in each case a characteristic of an assignment parameter in dependence upon the current difference(s) determined.

In accordance with one embodiment, the battery testing device is additionally configured to determine a characteristic of an assignment parameter from an individual measured voltage value and/or current value of the battery and/or from a current difference between the application current and a measured current.

In accordance with one embodiment, if all assignments carried out agree in respect of the assigned battery type the battery testing device is additionally configured to allocate that battery type to the tested vehicle battery as the result of the battery test.

When reference is made herein to a parameter, in case of doubt this is to be understood in the sense of an assignment parameter for identifying the battery type, unless the text indicates otherwise. In particular, the parameters mentioned hereinbelow are to be understood as being an assignment parameter: transition voltage difference parameter, pulse voltage difference parameter, voltage difference mean value parameter, voltage difference discharge parameter, pre-pulse voltage parameter, pulse current difference parameter, application current difference parameter.

In accordance with one embodiment, the assignment of a specific characteristic of an assignment parameter to a specific battery type can be effected on the basis of a comparison with empirical values and/or with battery models typical of a battery type in respect of the assignment parameter under consideration. This is preferably implemented with computer support, for example by means of a software-implemented table in a memory unit and a control unit of the battery testing device.

According to the invention there is also provided a battery testing system having at least one battery testing device in accordance with the invention, which is preferably operated by means of a method in accordance with the invention. A battery testing system is to be understood in accordance with the invention especially as being a system which has the conventional functionalities of a vehicle battery test, for example in a motor vehicle workshop and/or in a test laboratory and/or in a motor vehicle assembly line.

In order further to improve the quality of the battery type test, in accordance with a preferred development the battery testing device is constructed in such a way that, during the application of the pulse, a third voltage of the battery is measured at a third timepoint; a characteristic of a second assignment parameter is determined in dependence upon a second voltage difference between the second voltage and the third voltage; and a specific battery type is assigned to the tested battery in dependence upon the characteristic of the second assignment parameter.

In accordance with a preferred development, the battery testing device is constructed in such a way that a characteristic of a third assignment parameter is determined in dependence upon the first voltage; and a specific battery type is assigned to the tested battery in dependence upon the characteristic of the third assignment parameter. As a result, the information accuracy of the test may be further improved.

In accordance with a preferred development, a current measurement can also contribute to enhanced information accuracy of the test. For that purpose the battery testing device is preferably equipped with a current measuring unit and is constructed so that, during the application of the pulse, a second current of the battery is measured at a second timepoint and a third current of the battery is measured at a third timepoint; a characteristic of a fourth assignment parameter is determined in dependence upon a first current difference between the second current and the third current; and a specific battery type is assigned to the tested battery in dependence upon the characteristic of the fourth assignment parameter.

In order to obtain a sufficiently reliable test result, in a preferred development it can be advisable for a battery type to be allocated to the battery only when at least two, especially three or four, of the assignment parameters have a characteristic that corresponds to the same battery type. Especially preferably, a battery type is allocated only when the first and the second assignment parameters have a characteristic that corresponds to the same battery type. Preferably, for that purpose the first, the second and the third assignment parameters must yield the same result.

If a plurality of assignment parameters are included in the final assignment of a battery type, in accordance with a preferred development the assignment parameters used in the assignment of a battery type can be weighted, it being possible to give the same weighting to all the assignment parameters used, a different weighting to all the assignment parameters used or the same weighting to some assignment parameters and a different weighting to other assignment parameters.

In order to ensure good differentiation especially between Li ion batteries and lead batteries, in accordance with a preferred development the characteristic of the first assignment parameter and the characteristic of the second assignment parameter is assigned to a battery of the Li ion type if it is smaller than a voltage difference threshold value, and is otherwise assigned to a battery of the lead type. The first and second assignment parameters are usually given different voltage difference threshold values.

Preferably the characteristic of the third assignment parameter is assigned to a battery of the Li ion type if it is greater than a voltage threshold value, and is otherwise assigned to a battery of the lead type.

Because the voltage values and/or voltage difference values and/or current values to be measured may depend upon different influencing factors, such as, for example, temperature, ageing and/or state of charge of the battery, as well as upon other disturbing variables, especially from other electronic components of the vehicle, in one embodiment the battery testing device has a sensor arrangement which has at least one sensor, preferably known per se, for detecting a value of a temperature, state of charge and/or an ageing state of the battery and/or is configured to be connected to a battery management system of a battery being measured. The sensor arrangement can also have at least one sensor for detecting values of a capacity of a vehicle on-board network. By being able to take account of the mentioned parameters which may substantially affect, for example, the voltage values and/or voltage difference values and/or current values being measured as assignment parameters, the assignment of a battery type to a measured battery can be adapted in accordance with those parameters. The mentioned parameters can preferably be taken into account in the sense of an assignment parameter and/or by their influencing such an assignment parameter.

In order to be able to take account of operating conditions and/or environmental conditions of the battery being measured, the assignment of a battery type is effected in dependence upon at least one measured value of a sensor arrangement of the battery testing device and/or a battery management system of the battery being measured.

In accordance with a preferred development, a battery type "lead" is assigned to a voltage value and/or voltage difference value and/or current value to be measured if the first voltage difference of the first assignment parameter is 0.6 V or more and/or if the second voltage difference of the second assignment parameter is more than 0.1 V and/or if the first voltage of the third assignment parameter is less than 13 V.

In a preferred development, a battery type "Li ion" is assigned to a voltage value and/or voltage difference value and/or current value to be measured if the first voltage difference of the first assignment parameter is less than 0.6 V and/or if the second voltage difference of the second assignment parameter is less than 0.1 V and/or if the first voltage of the third assignment parameter is 13 V or more.

In respect of the third assignment parameter, in the case of certain applications voltage threshold values of 10 V or 11 V can also come into consideration.

In accordance with one embodiment, the battery testing device has an interface to sensors and/or to a battery management system of the battery being tested, which interface is configured to access measured values of a temperature, a state of charge and/or an ageing state of the battery.

In a preferred embodiment, the battery testing device is configured, especially by means of a battery test in accordance with the invention, to differentiate between various battery types, preferably of the "Li ion" type and of the "lead" type. Such differentiation is preferably effected on the basis of the assignment to one of those battery types.

Advantageous arrangements of the different aspects of the invention are the subject matter of the subsidiary claims. Further features, advantages and possible applications of the invention will be found in the following description in conjunction with the Figures, which show, partly in diagrammatic form:

Figure 1:
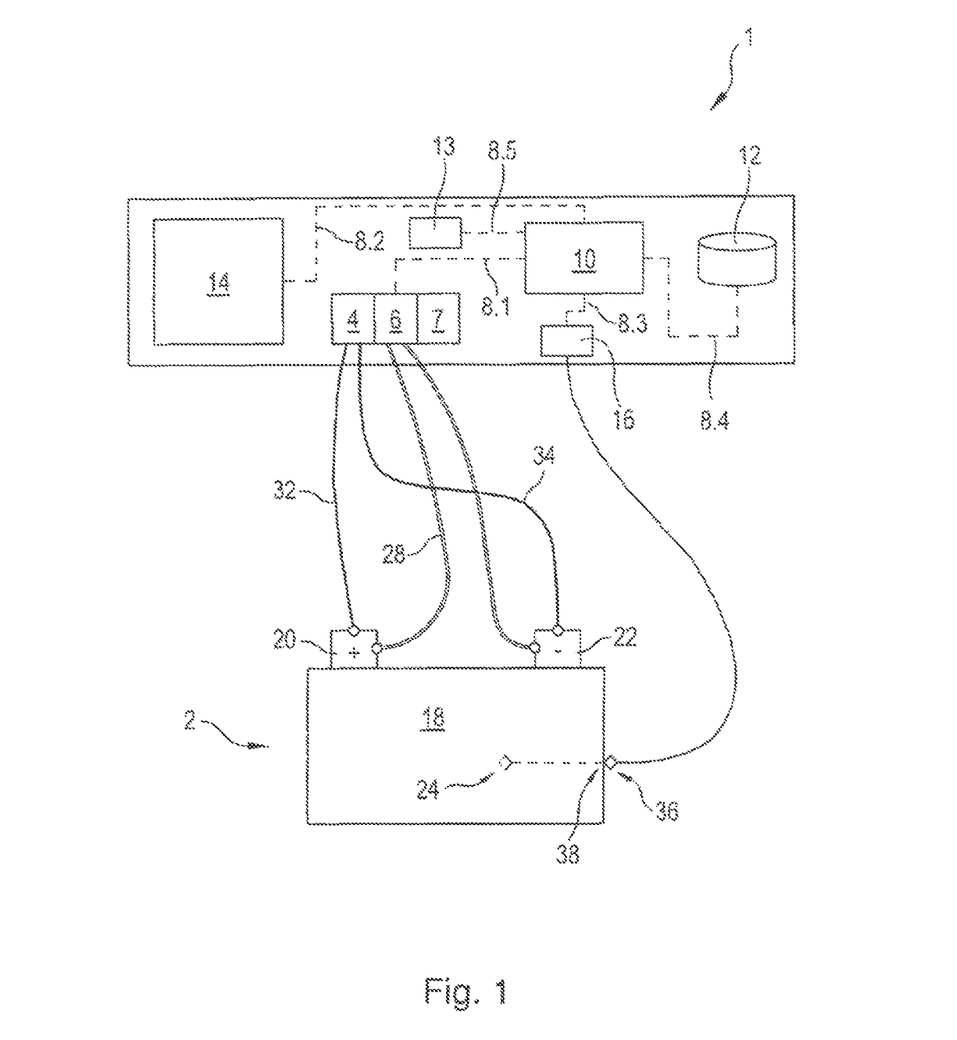
FIG. 1 in a sectional view a battery testing device in accordance with an embodiment of the invention with a connected battery to be measured.
Figure 2:
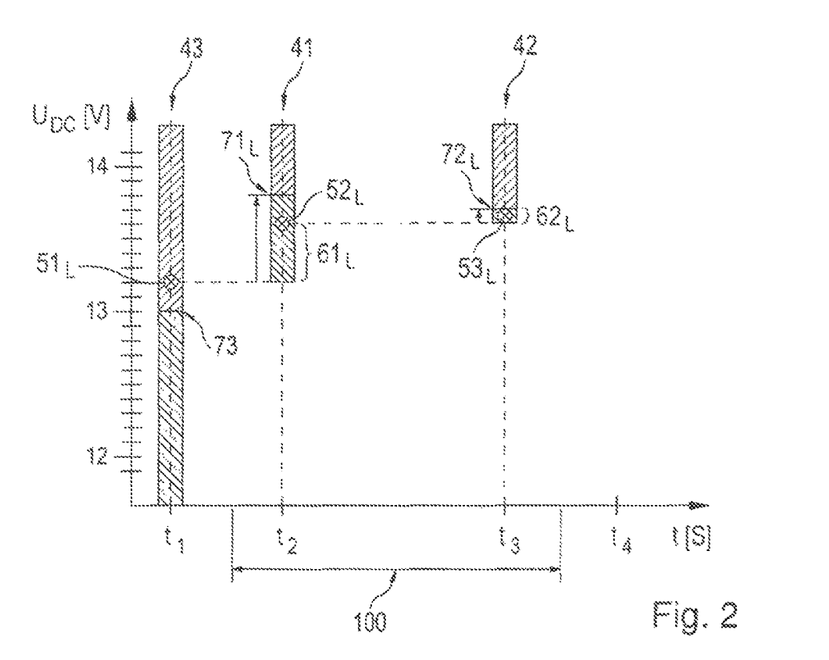
FIG. 2 a U-t diagram of a test result for a Li ion battery when a method in accordance with an embodiment of the invention is carried out.
Figure 3:
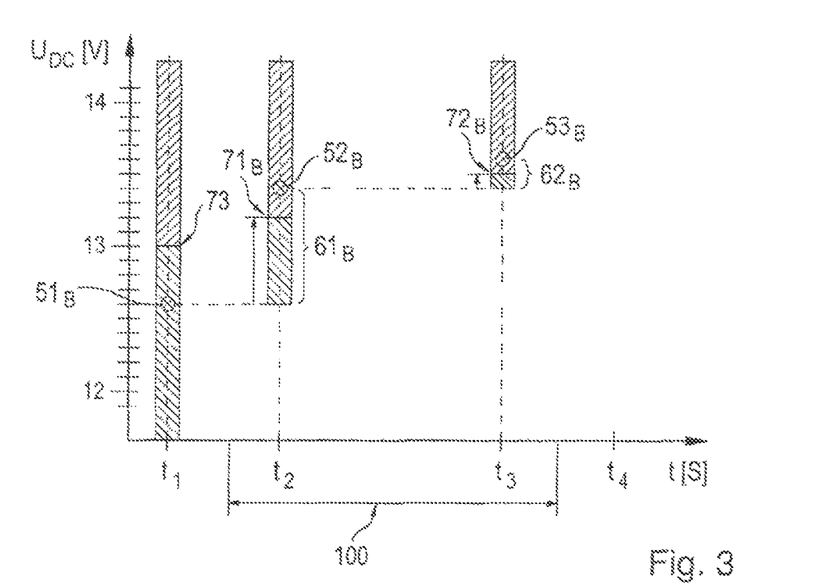
FIG. 3 a U-t diagram of a test result for a lead battery when a method in accordance with an embodiment of the invention is carried out.

FIGS. 1, 2 and 3 illustrate a battery testing device in accordance with an embodiment of the invention which can be operated by means of a method for identifying a battery type in accordance with an embodiment of the invention. The described battery testing device 1 is especially arranged to identify batteries 2 of the "lead battery" battery type and of the "lithium ion battery" battery type that are installed in motor vehicles and to differentiate them from one another. Irrespective thereof it will be understood that the invention can also be applied to any other battery types.

FIG. 1 shows a battery testing device 1 which, for carrying out the method for identifying the battery type, is connected to a battery 2 to be tested. In the diagram the battery 2 is separate; in accordance with the invention, however, the battery can also be installed in, for example, a motor vehicle (not shown herein).

The battery testing device 1 has: a voltage measuring unit 4, a DC generator 6 and optionally a current measuring unit 7. By means of the DC generator 6, a DC pulse can be generated over a period of one or more seconds or longer. The voltage measuring unit 4, if applicable the current measuring unit 7 and the DC generator 6 are connected, electrically and for signal transmission, to a control unit 10 of the battery testing device 1 via the line 8.1 indicated by a dotted line. The control unit 10 is additionally connected to a memory unit 12, a display unit 14 and a sensor arrangement 16 by means of further lines. In addition, the control unit 10 is connected by means of a further line 8.5 to a timer 13 which enables the DC pulse to be applied to the battery 2 being tested over a predetermined period of time, in this case preferably five or ten seconds. The timer is preferably in the form of a conventional component of the control unit 10.

The battery 2 to be tested has an energy storage means 18 having secondary cells (not shown) of a specific battery type and poles 20 (positive, represented by the + sign) and 22 (negative, represented by the —sign) connected to the energy storage means 18. In addition, the battery 2 has a battery management system 24 which has sensors (not shown) for detecting a temperature, a state of charge and/or an ageing state of the battery.

For carrying out the exemplary method for identifying the battery type of the battery 2 being tested, each of the poles 20 and 22 is connected by means of a connector to the battery testing device 1. The connector has for each pole 20 and 22 a power connection 28, 30 for application of the DC current and a measurement connection 32, 34 for voltage measurement and accordingly for measurement of a plurality of voltage values U at different timepoints $t_1$, $t_2$, $t_3$ and $t_4$.

In addition, in this exemplary embodiment there can optionally be arranged on the battery 2 a temperature sensor 36, which is connected to the sensor arrangement 16, for measuring the temperature of the surface and/or environment of the battery. In this exemplary embodiment that sensor 36 is then arranged close to an interface 38 via which the sensor arrangement 16 is connected to the battery management system 24, but could also be arranged at some other location specific to the application.

The mode of operation of the battery testing device 1 in accordance with the described embodiment of a test method according to an embodiment of the invention in which lithium ion batteries and lead batteries are to be differentiated is described below with reference to FIGS. 2 and 3.

In the embodiment shown in FIGS. 2 and 3, the first assignment parameter 41, the second assignment parameter 42 and the third assignment parameter 43 are taken into account in order to determine to which of the two mentioned battery types the battery being tested belongs.

The third assignment parameter 43 relates to the timepoint $T_1$ before the introduction of the DC pulse 100 and is dependent upon the measured first voltage 51. Values for the first voltage 51 of 13 V (third threshold value 73) or more are assigned to lithium ion batteries, lower values to lead batteries.

The second assignment parameter 42 relates to the transition from the timepoint $T_1$ before the introduction of the DC pulse 100 to the timepoint $T_2$ at the beginning of the DC pulse 100 and is dependent upon the first voltage difference 61 between the measured first voltage 51 and the measured second voltage 52. Values for the first voltage difference 61 of 0.6 V (first threshold value 71) or more are assigned to lead batteries, lower voltage differences to lithium ion batteries.

The first assignment parameter 41 relates to the build-up of the voltage during the DC pulse 100 and is dependent upon the second voltage difference 62 between the measured second voltage 52 and the measured third voltage 53. Values for the second voltage difference 62 of 0.1 V (second threshold value 72) or more are assigned to lead batteries, lower voltage differences to lithium ion batteries.

A test result (that is to say the information "Li ion battery" or the information "lead battery") is output on the display 14 only if the characteristic of each of the three assignment parameters 41, 42 and 43 is assigned to the corresponding battery type. In that respect the three assignment parameters are equally weighted.

The third assignment parameter results from the measured first voltage 51 and has the characteristics greater than or equal to 13 V and less than 13 V. The characteristic greater than or equal to 13 V is assigned to batteries of the "Li ion" type, because the latter have corresponding voltages. The characteristic less than 13 V is accordingly assigned to batteries of the "lead" type.

FIG. 2 shows the case where, as a result of the characteristics of the three assignment parameters 41, 42 and 43, the battery type "Li ion" is assigned to the battery being tested. The first voltage $51_L$ at timepoint $T_1$ is 13.2 V and therefore more than 13 V. That characteristic of the third assignment parameter 43 is consequently assigned to a lithium ion battery.

The second voltage $52_L$ at timepoint $T_2$ is 13.6 V. The first voltage difference $61_L$ is therefore 0.4 V and consequently less than 0.6 V. Accordingly, that characteristic of the first assignment parameter 41 is assigned to a lithium ion battery.

The third voltage $53_L$ at timepoint $T_3$ is 13.65 V. The second voltage difference $62_L$ is therefore 0.05 V and consequently less than 0.1 V. Accordingly, that characteristic of the second assignment parameter 42 is likewise assigned to a lithium ion battery.

Since the characteristics of each of the assignment parameters 41, 42 and 43 are assigned to a lithium ion battery, "Li ion battery" is output as the test result on the display 14.

FIG. 3 illustrates the case where, as a result of the characteristics of the three assignment parameters 41, 42 and 43, battery type "lead" is assigned to the battery being tested. The first voltage $51_B$ at timepoint $t_1$ is 12.6 V and therefore less than 13 V. That characteristic of the third assignment parameter 43 is consequently assigned to a lead battery.

The second voltage $52_B$ at timepoint $t_2$ is 13.4 V. The first voltage difference $61_B$ is therefore 0.8 V and consequently more than 0.6 V. Accordingly, that characteristic of the first assignment parameter 41 is assigned to a lead battery.

The third voltage $53_B$ at timepoint $t_3$ is 13.6 V. The second voltage difference $62_B$ is therefore 0.2 V and consequently more than 0.1 V. Accordingly, that characteristic of the second assignment parameter 42 is likewise assigned to a lead battery.

Since the characteristics of each of the assignment parameters 41, 42 and 43 are assigned to a lead battery, "lead battery" is output as the test result on the display 14.

Relevant environmental and operating conditions of the battery being tested, such as temperature, state of charge or ageing state, can be recorded by means of the sensor arrangement 16 and/or a battery management system 24 of the battery 2 and in the embodiment shown can optionally be incorporated into the reliability criterion and/or into the assessment of the assignment parameters and/or as further assignment parameters.

If, in an embodiment not shown, such environmental and/or operating conditions are not determined by means of a battery management system of the battery being tested, it is possible for values relating to the current temperature of the battery to be recorded directly at one of the two battery poles to which the connectors 28, 30, 32 and 34 are in any case applied, for example by means of a different temperature sensor (not shown), especially the sensor arrangement 16. One of those connectors can be configured to receive the temperature sensor and its connection, for example at a binding post. For the purposes of the invention the temperature of the metal battery pole can be sufficiently representative of temperatures in the interior of the battery. In such an embodiment a state of charge can be determined in dependence upon a voltage "U" applied to and measured at the measurement connectors 32, 34, an ageing state in dependence upon a DC resistance of the battery which is then to be measured.

In the exemplary embodiment of FIGS. 2 and 3, current values, for example measured at timepoints $t_2$ and $t_3$, are not determined and are not used in the determination of the battery type, but this would be readily possible within the scope of the invention using a battery testing device according to FIG. 1. The battery testing device according to FIG. 1, however, is arranged to measure such current values and to use determined measured values or measured value differences in accordance with the invention.

In the exemplary embodiment of FIGS. 2 and 3, measurement of current values and/or voltage values at a timepoint $t_4$ after the DC pulse is not carried out and is not used in the determination of the battery type. The battery testing device according to FIG. 1, however, is arranged to carry out such measurements and to use determined measured values or measured value differences in accordance with the invention.

In the embodiment shown, no battery type is assigned if the results from the characteristics of the first and second assignment parameters, preferably also of the third assignment parameter, do not point to the same battery type. A conflicting result can initiate repetition of the measurement.

Figure 4:
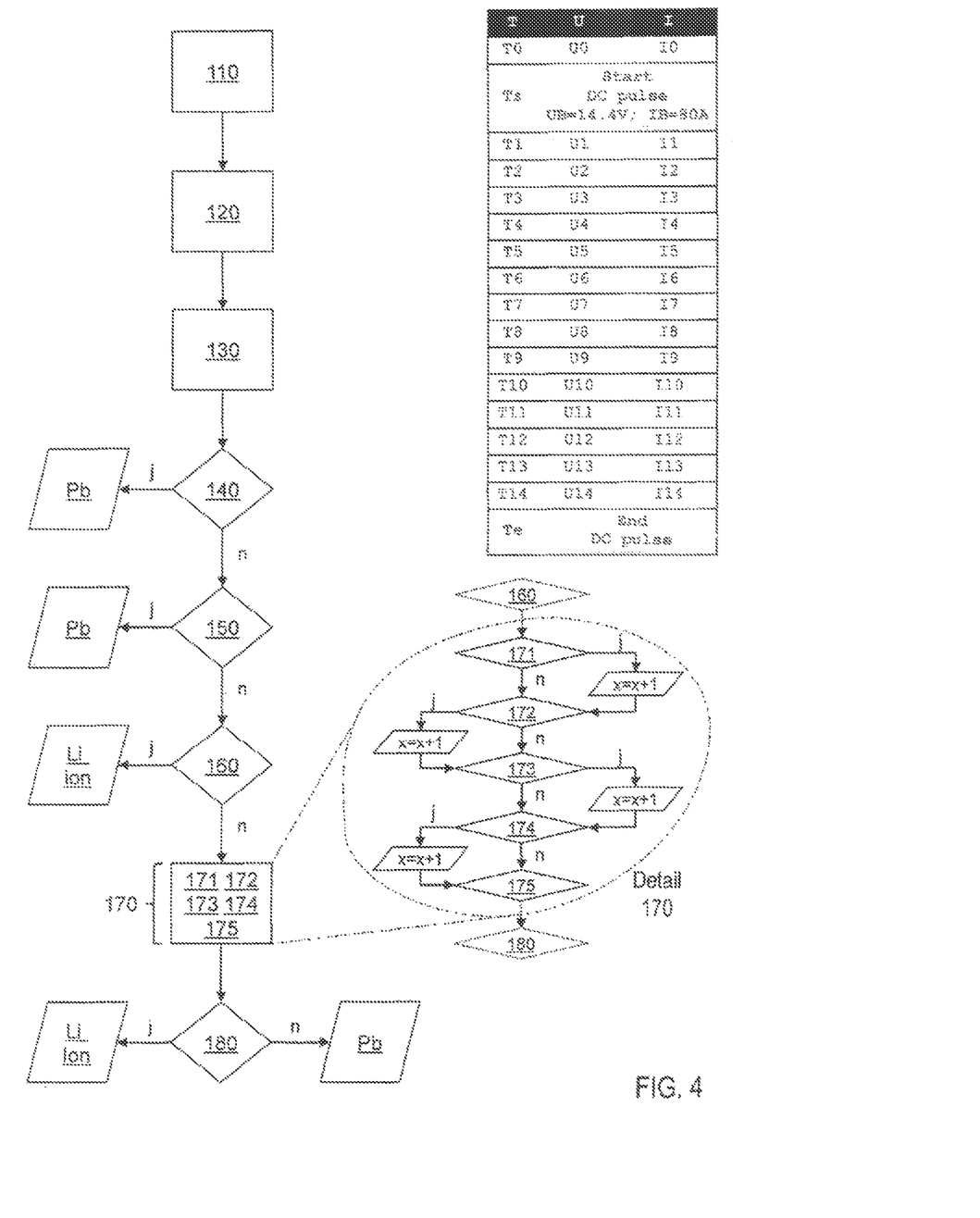
FIG. 4 a flow diagram of a battery test which is carried out with a battery testing device in accordance with an exemplary embodiment of the invention using a method in accordance with an exemplary embodiment of the invention.

In FIG. 4, in respect of the method carried out for identifying a battery type there is described an exemplary embodiment which is independent of that of FIGS. 1 to 3; the battery testing device used for that purpose can correspond to that of FIG. 1 but can also be constructed in accordance with a different exemplary embodiment of the invention. FIG. 4 shows a flow diagram of a battery test which is carried out with a battery testing device 1 in accordance with an exemplary embodiment of the invention using a method in accordance with an exemplary embodiment of the invention.

The battery test in accordance with this exemplary embodiment serves for differentiating between batteries connected to a motor vehicle. Many current vehicle models, depending upon the standard or extra equipment provided, are provided with either a battery of the lithium ion type (Li ion) or with a battery of the lead battery type (Pb). In the case of Just-in-Time or Just-in-Sequence production which is provided in motor vehicle assembly lines, it is routinely the case that, in an assembly line, vehicles fitted with a lead battery and fitted with a lithium ion battery are assembled in succession in an irregular order.

For various functions—such as, for example, the charging of the vehicle battery in accordance with the vehicle customer's or the vehicle manufacturer's requirements—a charging device provided on the assembly line must have inter alia a battery testing device 1 for identifying the battery type of the battery 18 installed. Such a battery testing device 1 and the performance of a battery test for identifying the battery type is described in this exemplary embodiment. The individual steps of the method with the functional relationships are explained and described in detail below:

In step 110, the vehicle battery 18, connected to the on-board network of the vehicle, is connected to the battery testing device 1 by connecting the connectors 28, 30, 32 and 34 to the poles 20 and 22.

In step 120—that is to say before application of the DC pulse to the battery—the pre-pulse voltage U0 and the pre-pulse current I0 of the battery are measured at a timepoint T0.

In step 130, a DC pulse having a voltage of 14.4 V and a current strength of 80 A is applied to the battery for a period ΔT of ten seconds, the DC pulse being applied to the battery from the start timepoint Ts to the end timepoint Te. The measurement timepoint T0 is before the start timepoint Ts; the measurement points T1 to T14 are between the start timepoint Ts and the end timepoint Te (see Table in FIG. 4). In other exemplary embodiments, a different voltage and/or a different current strength can be applied.

During the application of the DC pulse, a pulse voltage U1 to U4 and a pulse response current I1 to I4 are each measured at time intervals, preferably uniformly distributed time intervals, at various timepoints T1 to T14.

On the basis of the measured voltages U0 to U14 and response currents I0 to I14, the respective characteristics of various assignment parameters are determined in method steps 140 to 180.

On the basis of the characteristic determined in each case there is preferably determined for each assignment parameter used, by comparison with a stored table for that assignment parameter, whether and, if so, to which battery type the tested battery is to be assigned in respect of that assignment parameter. The appropriate table preferably contains a plurality of characteristics to be expected in respect of the assignment parameter for each of those characteristics for assignment to a battery type.

The assignment parameters used for differentiating between lead batteries and lithium ion batteries in the described exemplary embodiment are described below in connection with that method step in which they are applied:

Steps 140 to 160 serve especially but not exclusively for the simplest possible way of differentiating between fully charged batteries of different battery types.

In step 140, a characteristic of an application current difference parameter is determined from the application current difference between the application current IB and the last measured pulse response current I14. If that current difference is greater than a threshold value (especially greater than five to 20 Ampere, for example greater than 10 Ampere), battery type Pb is assigned to the tested battery in respect of that assignment parameter.

In addition, in step 140, a characteristic of a pulse current difference parameter is determined from a current difference between the first pulse response current I1 and a later pulse response current (for example I4 or I9). If that current difference reveals that the pulse response current measured later is greater, especially significantly greater, than the pulse response current measured earlier, battery type Pb is assigned to the tested battery in respect of that assignment parameter.

If the two assignments determined in step 140 point to a lead battery, battery type Pb is allocated to the battery being tested (see "j" by the arrow from method step 140 in FIG. 4 to the allocation "Pb").

If, in step 140, it is not possible to make a clear assignment to a lead battery (see "n"), in step 150 reference is additionally made to a pre-pulse voltage parameter. If the pre-pulse voltage U0 is less than a threshold value (especially less than 12.5 to 12.9 Volt, for example less than 12.8 Volt), battery type Pb is assigned to the tested battery in respect of that assignment parameter. Virtually all lead batteries fulfil that criterion, with the possible exception of batteries which have been charged immediately beforehand.

If, in addition to the assignment determined in step 150, the assignment determined in step 140 in respect of the application current difference parameter points to a lead battery, battery type Pb is allocated to the battery being tested (see "j" by the arrow from method step 150 in FIG. 4 to the allocation "Pb").

If, in step 150, it is likewise not possible to make a clear assignment to a lead battery (see "n"), in step 160 reference is additionally made to a further pre-pulse voltage parameter. If the pre-pulse voltage U0 is greater than a threshold value (here especially greater than 12.9 to 13.6 Volt, for example greater than 13.2 Volt), battery type Li ion is assigned to the tested battery in respect of that assignment parameter.

In addition, in step 160, a characteristic of a further pulse current difference parameter is determined from a current difference between the first pulse response current I1 and the last pulse response current I14. If this current difference reveals that, as the pulse progresses, the current strength falls by more than a threshold value (especially greater than five to 20 Ampere, for example greater than 10 Ampere), battery type Li ion is assigned to the tested battery in respect of that assignment parameter.

If the two assignments determined in step 160 point to a lithium ion battery, battery type Li ion is assigned to the battery being tested (see "j" by the arrow from method step 160 in FIG. 4 to the allocation "Li ion").

Depending upon the application and the required information accuracy, in the exemplary embodiment described here it can also be sufficient, especially for differentiating between fully charged batteries, to carry out only one or two of steps 140, 150 and 160 in order to allocate a battery type to the battery being tested.

Steps 170 to 180 serve especially but not exclusively for the simplest possible way of differentiating between nonfully charged batteries of different battery types. Those steps therefore also make it possible to identify the battery type in the case of batteries in any state of charge.

In step 170, joint consideration is given to a plurality of different assignment parameters for which the respective characteristic of the tested battery is determined in sub-steps 171 to 175.

For each of sub-steps 171 to 175—that is to say for the respectively associated assignment parameter—there is determined, by comparison with the respective table, whether its characteristic is to be assigned to a lithium ion battery. If that is the case (see "j" in detailed view of step 170), a counter x is increased by one step (x=x+1).

In step 180, battery type Li ion is assigned to the battery being tested if the counter x reaches a certain threshold value (see allocation "j" at step 180), in the present case, for example, a threshold value of three. In the exemplary embodiment that means that battery type Li ion is allocated when at least three of assignment parameters 171 to 175 indicate assignment to the battery type Li ion. If that is not the case, battery type Pb is allocated (see allocation "n").

The assignment parameters of sub-steps 171 to 175 are described in greater detail below:

In sub-step 171, reference is made to a further pre-pulse voltage parameter. If the pre-pulse voltage U0 reaches a threshold value or is greater than that value (here especially greater than or equal to 12.5 to 13.2 Volt, for example greater than or equal to 12.8 Volt), battery type Li ion is assigned to the tested battery in respect of that assignment parameter.

In sub-step 172, reference is made to a transition voltage difference parameter the characteristic of which is determined from a voltage difference between the pre-pulse voltage U0 and the first pulse voltage U1. If that voltage difference reveals that after the application of the DC pulse to the battery the voltage increases by less than a threshold value (here especially 1.5 to 2.2 Volt, for example 1.8 Volt), battery type Li ion is assigned to the tested battery in respect of that assignment parameter.

In sub-step 173, a characteristic of a pulse voltage difference parameter is determined from a voltage difference between the first pulse voltage U1 and the last pulse voltage U14. If that voltage difference reveals that, as the pulse progresses, the voltage increases by less than a threshold value (especially less than 0.20 to 0.40 Volt, for example less than 0.30 Volt), battery type Li ion is assigned to the tested battery in respect of that assignment parameter.

In sub-step 174, a characteristic of a voltage difference mean value parameter is determined by determining a mean value of voltage differences arising between all pairs of voltages measured at adjacent times (mean value of [U1-U0, U2-U1, . . . , U14-U13]). If that mean value is smaller than a threshold value (especially less than 0.1 to 0.2 Volt, for example less than 0.16 Volt), battery type Li ion is assigned to the tested battery in respect of that assignment parameter. As further assignment parameters not considered here it is also possible to take into account a mean absolute deviation of the voltage difference from the mean value calculated in sub-steps 174.

In sub-step 175, a characteristic of a voltage difference discharge parameter is determined by determining the development over time of the voltage changes between voltages measured at adjacent times. For that purpose, for example, a method of numerical integration with increasing difference quotients can be used. If the value so determined for the discharge remains below a specific threshold value (especially less than 0.05 to 0.1, for example less than 0.075), battery type Li ion is assigned to the tested battery in respect of that assignment parameter.

Depending upon the application and the required information accuracy, in the exemplary embodiment described here it can also be sufficient, especially for differentiating between partially charged batteries, to carry out only one or two or three or four of sub-steps 171, 172, 173, 174 and 175 in order to allocate a battery type to the battery being tested.

If, in that context, the number of assignment parameters used in step 170 is different from that shown in FIG. 4, it is accordingly also possible for the threshold value to be adapted in respect of the counter x for the allocation of a specific battery type. Independently of the number of assignment parameters considered in step 170, by means of a counter increase y (x=x+y) matched to a specific assignment parameter, it is possible to weight the individual assignment parameters if the characteristic of one or more specific assignment parameters is more relevant to the allocation of the battery type than the characteristic of one or more other assignment parameters.

For example, once it has been ensured that the battery being tested has been connected to the vehicle but no large consumers, such as, for example, an air-conditioning system or a seat heating system, are so configured, reliable identification of the battery type can also be carried out preferably only on the basis of steps 110, 120, 130, 150, 172, 173 and 174.

The invention claimed is:

1. A method for identifying a battery type (Pb, Li ion) by means of a battery testing device (1), having the steps:
    application of a DC pulse having a current strength (IB) of at least 30 Ampere to a battery (18) to be tested for at least five seconds,
    before the application of the pulse, measurement of a pre-pulse voltage (U0) of the battery,
    during the application of the pulse, measurement of a pulse voltage (U1) of the battery,
    determination of a transition voltage difference between the pre-pulse voltage and the pulse voltage,
    determination of a characteristic of a transition voltage difference parameter in dependence upon the transition voltage difference,
    assignment of a specific battery type (Pb, Li ion) to the tested battery in dependence upon the characteristic.

2. The method according to claim 1, wherein the DC pulse has an at least substantially constant current strength (IB) in the range of between 60 and 120 Ampere.

3. The method according to claim 1, wherein the DC pulse is applied to the battery for a period in the range of between eight and 15 seconds.

4. The method according to claim 1, having:
    measurement of at least one further pulse voltage (U2-U14) of the battery at at least one further timepoint (T2-T14) during the application of the pulse,
    determination of a characteristic of at least one pulse voltage difference parameter in dependence upon a pulse voltage difference between two measured pulse voltages,
    assignment of a specific battery type to the tested battery in dependence upon the characteristic.

5. The method according to claim 4, wherein a pulse voltage (U1-U14) of the battery is measured at a plurality of timepoints (T1-T14), especially a total of ten or fifteen timepoints, during the application of the pulse, and wherein a characteristic of at least one further pulse voltage difference parameter is determined in dependence upon at least one pulse voltage difference between two of the measured pulse voltages, and wherein a specific battery type is assigned to the tested battery in dependence upon the characteristic.

6. The method according to claim 4, wherein a characteristic of a voltage difference mean value parameter is determined in dependence upon a mean value of voltage differences arising between voltages measured at adjacent times before or during the application of the pulse, and wherein a specific battery type is assigned to the tested battery in dependence upon the characteristic.

7. The method according to claim 4, wherein a characteristic of a voltage difference discharge parameter is determined in dependence upon the development over time of the voltage changes between voltages measured at adjacent times before or during the application of the pulse, and wherein a specific battery type is assigned to the tested battery in dependence upon the characteristic.

8. The method according to claim 1, wherein a characteristic of a pre-pulse voltage parameter is determined in dependence upon the pre-pulse voltage (U0), and wherein a specific battery type is assigned to the tested battery in dependence upon the characteristic.

9. The method according to claim 1, wherein a pulse response current (I1-I14) is measured at each of a plurality of timepoints (T1-T14) during the application of the DC pulse, and wherein a characteristic of at least one pulse current difference parameter is determined in dependence upon at least one current difference between two measured pulse response currents, and wherein a specific battery type is assigned to the tested battery in dependence upon the characteristic.

10. The method according to claim 1, wherein a characteristic of an application current difference parameter is determined in dependence upon at least one application current difference between the application current (IB) and a measured pulse response current, and wherein a specific battery type is assigned to the tested battery in dependence upon the characteristic.

11. The method according to claim 1, wherein a pulse response current (I1-I14) of the battery is measured at a plurality of timepoints (T1-T14), especially a total of ten or fifteen timepoints, during the application of the pulse, and wherein a characteristic of at least one further pulse current difference parameter is determined in dependence upon at least one current difference between two of the measured pulse response currents, and wherein a specific battery type is assigned to the tested battery in dependence upon the characteristic.

12. The method according to claim 11, wherein both a pulse voltage (U1-U14) and a pulse response current (I1-I14) of the battery are measured at a plurality of timepoints (T1-T14), especially a total of ten or fifteen timepoints, during the application of the pulse.

13. The method according to claim 1, wherein in dependence upon the assignment of the tested battery to a specific battery type in respect of one or more parameters, especially the assignment parameters under consideration, a specific battery type is allocated as test result if a characteristic which has been assigned to the same battery type (Pb, Li ion) is present in respect of all of the parameters under consideration or in respect of a predetermined proportion thereof.

14. The battery testing system operated by means of a method according to claim 1.

* * * * *